· US006080354A

United States Patent [19]
Miyajima

[11] Patent Number: 6,080,354
[45] Date of Patent: Jun. 27, 2000

[54] RESIN MOLDING METHOD IN WHICH A MOVABLE CAVITY PIECE ALLOWS A DIRECT RESIN FEED

[75] Inventor: Fumio Miyajima, Nagano, Japan

[73] Assignee: Apic Yamada Corporation, Nagano, Japan

[21] Appl. No.: 09/070,872

[22] Filed: May 1, 1998

[30] Foreign Application Priority Data

May 1, 1997 [JP] Japan ..................... 9-113921

[51] Int. Cl.[7] ............................ B29C 45/02; B29C 70/70
[52] U.S. Cl. .................... 264/511; 264/272.17; 264/276; 264/328.4; 264/316; 425/116; 425/544
[58] Field of Search .................. 264/272.17, 272.11, 264/272.15, 316, 328.4, 328.5, 510, 511, 276, 266; 425/116, 117, 121, 543, 544

[56] References Cited

U.S. PATENT DOCUMENTS

| H1654 | 6/1997 | Rounds | 264/272.17 |
|---|---|---|---|
| 4,347,211 | 8/1982 | Bandoh | 264/297 |
| 4,650,626 | 3/1987 | Kurokawa | 264/328.5 |
| 5,098,626 | 3/1992 | Pas | 264/151 |
| 5,674,343 | 10/1997 | Hotta et al. | 264/272.17 |
| 5,735,040 | 4/1998 | Ochi et al. | 264/272.17 |
| 5,800,841 | 9/1998 | Miyajima | 425/544 |

FOREIGN PATENT DOCUMENTS

| 0 665 584 A1 | 8/1995 | European Pat. Off. . |
|---|---|---|
| 0 747 942 A2 | 12/1996 | European Pat. Off. . |
| 8-340015 | 12/1996 | Japan . |

OTHER PUBLICATIONS

Semiconductor Packing Update, The Industry's First Newsletter Devoted to Semiconductor Packaging; 1994 vol. 9, No. 6, Editor and Publisher: Dr. Subashi Khadpe.

Primary Examiner—Angela Ortiz
Attorney, Agent, or Firm—Sughrue, Mion, Zinn, Macpeak & Seas, PLLC

[57] ABSTRACT

A resin molding method by which resin is filled into a cavity while an article to be molded is clamped between upper and lower molding dies, wherein a cavity indentation is formed from an end face of a cavity piece provided in a cavity hole formed in the molding piece and of an internal wall surface of the cavity hole, the method including the steps of: arranging the cavity piece provided in the lower molding die so as to be movable in a direction in which the molding dies are opened or closed; covering a parting surface of each of the resin molding dies with a release film; sucking the release film from an area in the vicinity of an inner bottom surface of the cavity indentation of the lower molding die, to thus form a storage section for storing resin used for a molding operation within the cavity hole; feeding a required amount of resin to the storage section; setting the article on the lower molding die and clamping the article between the resin molding dies; and pressing the cavity piece of the lower molding die to a resin molding position to thus cause the resin provided in the cavity to set, thereby molding the article with resin.

17 Claims, 8 Drawing Sheets

RESIN MOLDING METHOD IN WHICH A MOVABLE CAVITY PIECE ALLOWS A DIRECT RESIN FEED

BACKGROUND OF THE INVENTION

1. Field of the Invention

The present invention relates to a resin molding method and a resin molding apparatus used for manufacturing a plastic-sealed semiconductor device.

2. Description of the Related Art

A transfer molding apparatus is heavily used for manufacturing a semiconductor device through plastic molding. In a plastic molding apparatus of this type, a resin tablet is supplied to a pot. A lead frame to be molded is clamped between an upper molding die and a lower molding die, and resin melted in the pot is extruded from the pot by means of a plunger. The thus-extruded resin is filled into a cavity and thermally set, thus sealing a semiconductor element.

However, under the foregoing method by which a semiconductor element is sealed with resin by feeding a resin tablet to the pot and by forcefully feeding the resin melted in the pot to the cavity, molded resin is susceptible to mixing of air, because the resin tablet itself is liable to contain gas, and gas is likely to be mixed into resin during the course of filling resin into the cavity. Molding resin under a great dwell pressure in an existing transfer molding apparatus is intended to reduce the volume of air mixed into resin to as small a volume as possible.

In order to apply a great dwell pressure to the resin molding apparatus, it has been necessary to robustly manufacture molding dies. Further, a hydraulic press is used for applying a great clamping force to the molding dies. In a case where a resin tablet made by compacting resin is used as is used for an existing resin molding apparatus, melted resin does not necessarily have sufficient flowing characteristics, resulting in a problem of so-called wire sweep or the cavity being not filled with resin (hereinafter often referred to as "a non-filling failure").

To solve the foregoing problems, there has already been proposed a method of molding resin by feeding to a pot liquid resin in place of a solid resin tablet (Japanese Patent Application Laid-open No. Hei-8-340015). In short, this method is one by which resin is molded by feeding liquid resin to a pot while the resin is sealed with a plastic film. Use of liquid resin contributes to an improvement in the filling characteristics of resin in the cavity and prevention of wire sweep, because liquid resin has the superior flowing characteristics. Therefore, the foregoing method has the advantage of being able to reliably mold resin by preventing air from being mixed into the resin.

The existing resin molding apparatus has a pot, a cull, runners, and gates as a resin flow channel connecting the pot to the cavity. Resin remaining in the resin flow channel such as the cull or the runners after setting of resin is undesired resin which does not contribute to the molding of resin. There sometimes arises undesired resin which is substantially equal in amount to the resin filled into the cavity. Thus, the foregoing method suffers a problem of resin being wasted.

SUMMARY OF THE INVENTION

The present invention has been conceived to solve the foregoing problems, and the object of the present invention is to provide a resin molding method and a resin molding apparatus, both of which enable high-quality and more-efficient molding of resin and can be preferably applied to manufacture of a semiconductor device, or the like.

To accomplish the foregoing object, the present invention provides a resin molding method by which resin is filled into a cavity while an article to be molded is clamped between upper and lower molding dies, wherein a cavity indentation is formed from an end face of a cavity piece provided in a cavity hole formed in the molding piece and of an internal wall surface of the cavity hole, the method comprising the steps of:

arranging the cavity piece provided in the lower molding die so as to be movable in a direction in which the molding dies are opened or closed;

covering a parting surface of each of the resin molding dies with a release film;

sucking the release film from an area in the vicinity of an inner bottom surface of the cavity indentation of the lower molding die, to thus form a storage section for storing resin used for a molding operation within the cavity hole;

feeding a required amount of resin to the storage section;

setting the article on the lower molding die and clamping the article between the resin molding dies; and pressing the cavity piece of the lower molding die to a resin molding position to thus cause the resin provided in the cavity to set, thereby molding the article with resin.

Further, the resin molding method is characterized by the feature that after the parting surface of each of the resin molding has been covered with the release film, the article is molded with resin by sucking at least the release film, covering the lower molding die, from the area in the vicinity of the inner bottom surface of the cavity indentation.

Further, the resin molding method is characterized by the feature that application is applied to resin from the cavity piece when the resin filled into the cavity piece is molded with resin, and pressure is also applied to resin from the inner bottom surface of the cavity indentation.

Further, the resin molding method is characterized by the feature that thermosetting resin is used as the resin;

the temperature of the molding dies is maintained at a temperature range in which resin sets slowly during a period, over which resin is filled into the cavity by pressing the cavity piece; and after filling of resin into the cavity, the temperature of the molding dies is increased to a molding temperature at which the resin sets.

Further, the resin molding method is further characterized by the feature that after filling of resin into the cavity, the temperature of the molding dies is increased to a molding temperature at which the resin sets, when the resin is set; and the temperature of the molding dies having the cavity pieces are attached is maintained at a temperature at which resin sets slowly during a period.

Further, the resin molding method is further characterized by the feature that liquid resin is used as the resin, and the article is molded with resin by feeding a metered amount of resin to the storage section.

Further, the resin molding method is characterized by the feature that granular resin is used as the resin, and the article is molded with resin by feeding a metered amount of resin to the storage section.

Further, the resin molding method is characterized by the feature that a plurality of different types of resin materials of different composition are used in combination as the resin to be fed to the storage section.

Further, the resin molding method is characterized by the feature that resin into which a filler, such as ceramic powder or metallic powder, which settles down on the bottom of the storage section by virtue of a difference in specific gravity between the resin and the mixed resin when being supplied to the storage section, is used as one of the plurality of types of resin materials.

Further, the resin molding method is characterized by the feature that the resin is molded at a pressure of 1 to 5 Torr.

Further, the resin molding method is characterized by the feature that a film which permits passage of gas such as air or moisture and prevents passage of resin for molding purposes is used as the release film.

The present invention also provides a resin molding apparatus which includes molding dies whose parting surfaces are covered with a release film and which molds an article with a resin by directly feeding resin for resin purposes to a cavity, the apparatus comprising:

solely a cavity indentation as a resin forming section without use of a resin flow path, such as a pot used for feeding the resin to the resin molding dies or runners connecting the pot to the cavity; and feeding means for feeding resin to the cavity while the cavity indentation is covered with the release film.

Further, the resin molding apparatus is characterized by comprising:

an air suction hole used for sucking and supporting the release film such that the film is brought into contact with the parting surface of the resin molding die;

a cavity hole which is formed in each of the resin molding dies and which is formed in the inner bottom surface of the cavity;

a cavity piece which is fitted into each cavity hole;

the cavity indentation being formed from the end face of the cavity piece and the internal wall surface of the cavity hole;

a drive mechanism which is connected to and supports the cavity piece fitted into the lower molding die of the resin molding dies so as to be movable in the direction in which the molding dies are opened or closed;

a suction mechanism to form a storage section in the cavity indentation for storing resin by sucking the release film attached to the parting surface from an area in the vicinity of the inner bottom surface of the cavity indentation, by way of the air suction holes; and feeding means for feeding resin required for molding to the storage section.

Further, the resin molding apparatus is characterized by the feature that the resin feeding means is a dispenser which feeds liquid resin.

Further, the resin molding apparatus is characterized by the feature that the resin feeding means is one which feeds granular resin.

Further, the resin molding apparatus is characterized by the feature that the suction mechanism is provided with a pressuring mechanism which applies pressure to the resin filled in the cavity.

Further, the resin molding apparatus is characterized by the feature that a heater differing from those provided for the upper and lower molding pieces is incorporated in each of the cavity pieces, and the temperature of the cavity pieces can be controlled independently of that of the upper and lower molding dies.

Further, the resin molding apparatus is characterized by the feature that each of the cavity pieces comprises:

a bottom piece which constitutes the inner bottom surface of the cavity indentation;

a body which incorporates the heater;

a joint provided between the body and a flange; and a constricted bottom piece formed by notching the side of the cavity indentation and the back of corner of the same.

Further, the resin molding apparatus is characterized by the feature that each of the cavity pieces comprises a columnar bottom piece constituting the inner bottom surface of the cavity indentation and a body supporting the bottom piece; wherein the outer side surface of the bottom piece is partially notched; and wherein slots are formed in the outer surface for allowing flow of air between the slots and the internal wall surface of the cavity hole.

Further, the resin molding apparatus is characterized by the feature that an oscillation mechanism to apply minute oscillation to the resin fed to the storage section is connected to the cavity pieces.

DETAILED DESCRIPTION OF THE PREFERRED EMBODIMENTS

Preferred embodiments of the present invention will be described hereinbelow by reference to the accompanying drawings.

Figure 1:
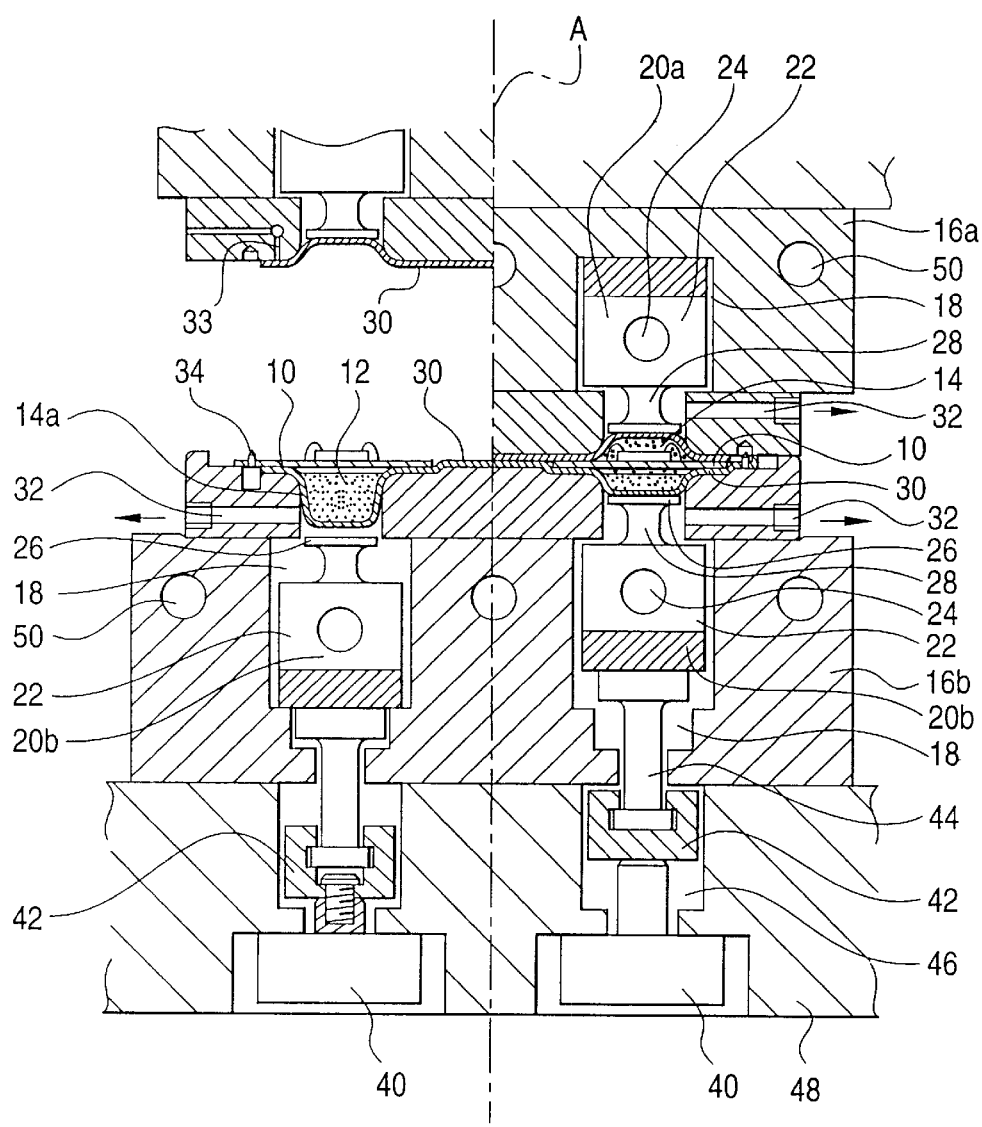
FIG. 1 is an explanatory view showing the principal elements of a resin molding apparatus and a resin molding method according to the present invention.

FIG. 1 is a cross-sectional view showing the structure of molding dies of a resin molding apparatus according to the present invention. The resin molding apparatus according to the present embodiment of the present invention is characterized by molding resin while a parting surface of each of the molding dies is coated with a release film, and by molding resin by direct feeding of resin to a cavity without use of a pot. Although in addition to liquid resin powdery or granular resin may be used as resin to be fed to the cavity, an explanation will describe the present embodiment with reference to a case where liquid resin is used.

The molding dices shown in FIG. 1 are used for molding resin while two lead frames, which are articles to be molded 10, are placed side by side to each other on a lower molding die. The left half of the drawing with reference to center line A shows the article 10 is set in a cavity indentation 14a while a parting surface of the molding die and the cavity is covered with a release film 30 and while the cavity indentation 14a is filled with resin 12. In contrast, the right half of the drawing with reference to center line A shows the article 10 is molded with resin by clamping it between an upper molding die 16a and a lower molding die 16b.

In the resin molding apparatus according to the present embodiment, each of the upper and lower molding dies 16a and 16b has a cavity hole 18 formed therein. Cavity pieces 20a and 20b are fitted into the respective cavity holes 18. Each of the cavity pieces 20a and 20b comprises a body 22 having a built-in heater 24, a flange 26 constituting an inner bottom surface of the cavity indentation 14a, and a bottom piece 28 which connects the flange 26 to the body 22. The flange 26 is in a recessed position with reference to the parting surface of the molding die. A cavity 14 is constituted of the inner side surface of the cavity hole 18 and the end face of the flange 26.

In the present embodiment, the cavity piece 20b to be fitted into the lower molding die 16b is molded from resin so as to be movable in the direction in which the molding dies are opened or closed. This is intended to enable an article to be molded with resin in the cavity without the use of a pot. Although both the cavity pieces 20a and 20b may be movable in the direction in which the molding dies are opened or closed, the cavity piece 20a provided in the upper molding die 16a is set stationary in the present embodiment, and only the cavity piece 20b provided in the lower molding die 16 is arranged so as to be movable when pressed.

In FIG. 1, reference numeral 40 designates a pressure cylinder for pressurizing the cavity piece 20b. The pressure cylinder 40 is connected to the cavity piece 20b by way of a slot 42 and a coupling member 44. The slot 42 is connected to and supports the cavity piece 20b positioned so as to correspond to the position of the article 10 in the cavity. Connection of the slot 42 to the cavity piece 20b by way of the coupling member 44 having a T-shaped engaging section has the advantage of being able to readily attach the coupling member 44 to the slot 42 by sliding even when products which require the cavity pieces to be positioned at different intervals are molded with resin. Although the pressure cylinder 40 is fixedly held in a base 48, another drive means such as an electric motor may be used in place of the pressure cylinder 40.

The cavity hole 18 and a slot insert hole 46 for receiving the slot 42 are formed to a size which enables the cavity piece 20b to be movable in the direction in which the molding pieces are opened or closed.

Each of the upper and lower molding pieces 16a and 16b has a built-in heater 50. The temperature of the molding pieces is controlled by application of power to the heaters 50 and the heaters 24 incorporated in the respective cavity pieces 20a and 20b. The body 22 belonging to each of the cavity pieces 20a and 20b is secured while a clearance of about 30 mm between the body 22 and the internal wall surface of the cavity hole 18. As a result, the cavity pieces 20a and 20b are thermally insulated from the upper and lower molding dies 16a and 16b, thus rendering control of temperature of the cavity pieces 20a and 20b easy.

As mentioned previously, the body 22 belonging to each of the cavity pieces 20a and 20b is connected to the flange 26 by way of a bottom piece 28. In the present embodiment, the bottom piece 28 is formed so as to become constricted by slightly notching several portions of the upper surface of the flange 26 which come into contact with the bottom surface of the cavity indentation 14a and by greatly cutting the lower edge of the flange 26 in the vicinity of the circumference of bottom surface of the cavity indentation 14a. The bottom piece 28 controls transfer of heat to the bottom surface of the cavity indentation 14a from the body 22. Since the transfer of heat is hindered by presence of the notches, the amount of heat transferred to the circumferential and bottom surface of the cavity indentation is reduced in the present embodiment. As a result, the flowing characteristics of resin to these areas at the time of molding of resin are improved, thus enabling suitable molding of resin. If there is no need to control the temperature of the molding dies with high accuracy, it is not necessary to form the bottom piece 28 in a constricted shape.

Slight clearance is ensured between the outer peripheral edge of the flange 26 belonging to each of the cavity pieces 20a and 20b and the internal wall surface of the cavity hole 18. The reason for this is that when the parting surface of the molding die is covered with the release film 30, a cavity space can be formed in the cavity indentation 14a by bringing the release film 30 in contact with the internal surface of the cavity indentation through suction. Reference numeral 32 designates a flow channel which permits suction of air from the cavity, and the flow channel 32 is connected to a suction mechanism disposed outside the molding dies. With regard to the cavity of the lower molding die 16b, the release film 30 is withdrawn and brought into contact with the inner surface of the cavity indentation 14a by suction, thus forming a resin storage section 30a from which resin 12 is fed.

In the present embodiment, one broad film which covers substantially the entire parting surface of the molding die is used as the release film 30. With a view to covering the parting surface of the molding die with the release film 30, a plurality of suction holes 33 are formed around the cavity indentation 14a and are connected to the suction mechanism disposed outside the molding die. With this arrangement, the release film 30 is brought into contact with the parting surface by suction. Here, there is no need to use one broad film as the release film 30, so long as the film is capable of covering the portions of the cavity where the articles 10 are set. For example, one release film 30 can be placed in each place where the article 10 is set.

A film used as the release film 30 has heat resistance sufficient to withstand the heating temperature of the molding die, release properties which enable ready removal of resin from the film, and malleability which causes the film to readily become deformed or stretched by suction. A film having the foregoing properties includes an FEP sheet film, a PET sheet film, fluorine-impregnated glass cloth, polyvinylidene, an ETFE sheet film, or the like.

A method of molding liquid resin through use of the resin molding apparatus having the foregoing structure will now be described.

First, the release film 30 is placed on the parting surface of each of the upper and lower molding dies 16a and 16b while the molding dies are opened. The release film 30 is brought into close contact with the parting surface in a flat manner by suction of air via the suction holes 33 formed in the parting surface. Subsequently, the suction mechanism sucks air from the flow channel 32, thus withdrawing the release film 30 to such an extent that the film is brought into contact with the inner bottom surface of the cavity indentation 14a.

At this time, the flange 26 of the cavity piece 20a of the upper molding die 16a is placed in substantially a position where it is situated at the time of final molding of an article. In order to ensure a volume for storing the resin needed by a molding operation within the lower molding die 16b, the flange 26 of the cavity piece 20b is lowered to a position lower than that at which the flange is situated at the time of a final molding operation, thus sucking the release film 30.

Figure 2:
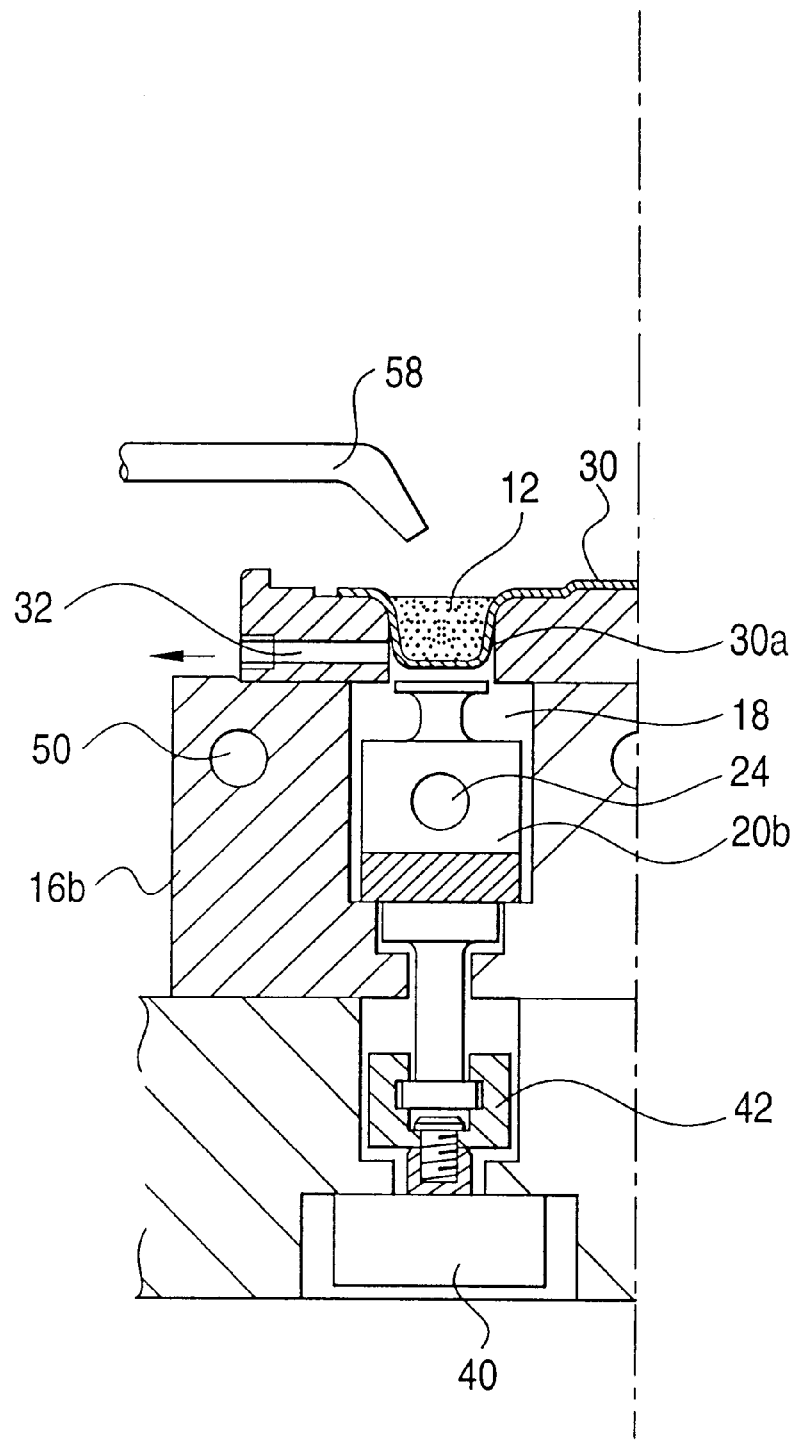
FIG. 2 is an explanatory view showing filling of resin into a storage section of a cavity.
Figure 3:
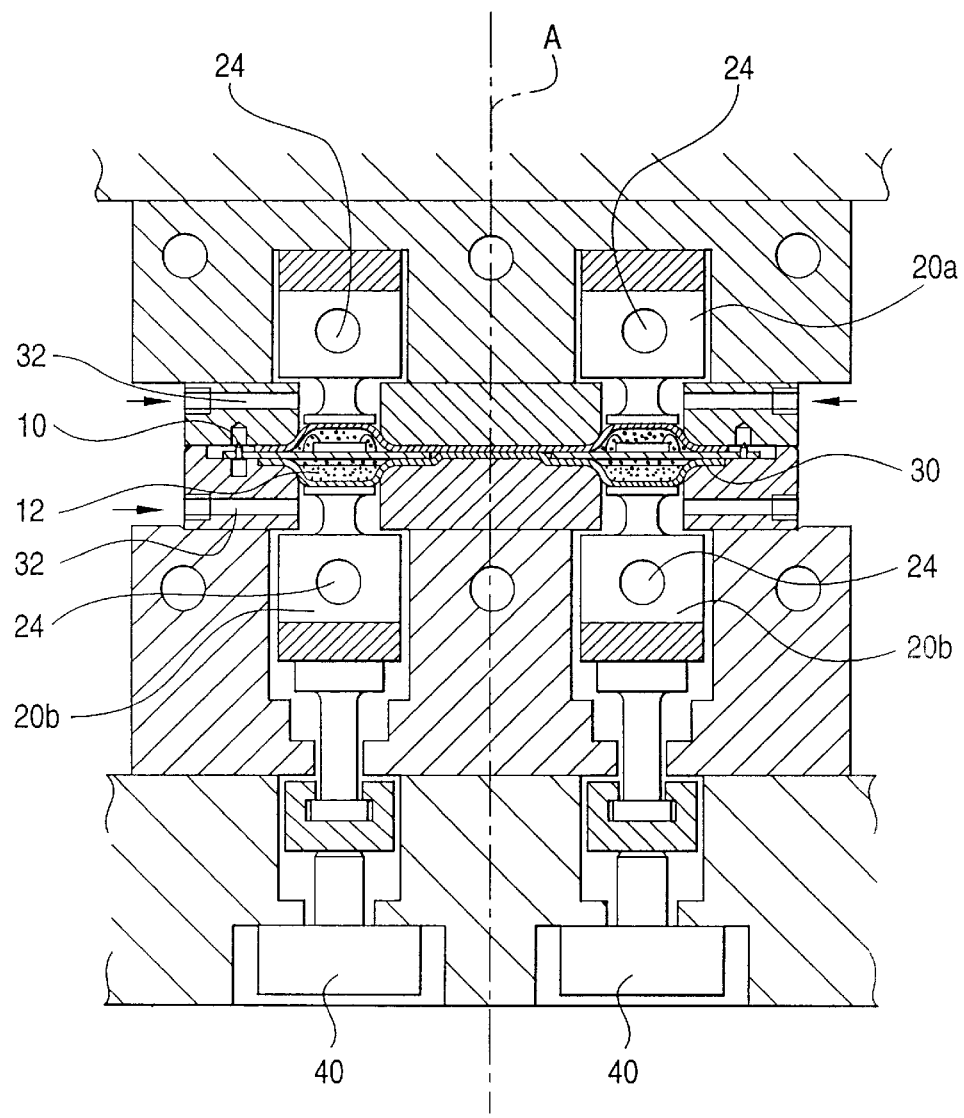
FIG. 3 is an explanatory view showing the resin molding method used for the resin molding apparatus according to the present invention.

FIG. 2 shows the resin 12 fed to the cavity of the lower molding die 16b while the release film 30 is held in a withdrawn position by suction. As a result of the cavity piece 20b being lowered to a lower position by suction, the release film 30 is withdrawn in the form of an indentation, thus forming the storage section 30a for storing the resin 12. Since the release film 30 is held in close contact with the parting surface, the film will not be displaced over the parting surface even if the film is sucked in the cavity.

While the release film 30b is withdrawn so as to form the storage section 30a in the lower molding die 16b by suction, the liquid resin 12 is metered and poured into each of the storage sections 30a from a multihead dispenser 58. The resin 12 to be fed to the storage 30a from the dispenser 58 should be free from mixing of air. An effective method of degassing the resin 12 is to cause the resin 12 to flow over a place of large area in a vacuum while an ultrasonic wave is applied to the resin.

A desired amount of resin to be fed to the storage section 30a is one required to mold an article with resin in the cavity 14. As seen from an illustrated example, in a case where both surfaces of the article 10 are molded with resin, the amount of resin to be fed to the storage section 30a corresponds to the amount of resin required to fill the entire cavity.

After a given amount of resin 12 has been filled into the storage section 30, the dispenser 58 is withdrawn to the outside of the molding die, thus setting the article 10 in a given position on the lower molding die 16b. The left half of FIG. 1 with reference to center line A shows the article 10 thus set in the given position. Reference numeral 34 designates a guide pin used for positioning and setting the article 10.

After having been set, the article 10 is clamped between the upper and lower molding dies 16a and 16b, proceeding to a resin molding operation.

In this state, the heating temperature of the upper and lower molding pieces 16a and 16b and that of the cavity pieces 20a and 20b are set to a temperature at which the resin 12 slowly sets, e.g., a temperature in the vicinity of the glass transition temperature. A temperature range in the vicinity of the glass transition temperature is one in which the characteristics of the resin 12 remain unchanged over a long period of time or in which the flowing characteristics of the resin 12 are in a superior state. When an article is molded with thermosetting resin, it is better to prevent acceleration of setting of the resin 12. Granted that the glass transition point of the resin 12 is 130° C., the heaters 24 and 25 are controlled such that the temperature of the molding dies equals a temperature of about 130° C.

A resin molding operation according to the present embodiment is performed while the cavity piece 20b of the lower molding die 16b is pushed to a molding position. More specifically, a press cylinder 40 is actuated to thereby push the cavity piece 20b to a given position. The right half of FIG. 1 with reference to center line A shows the cavity piece 20b held in the given elevated position. At this time, air is sucked from the flow channel 32 to thereby fill the resin 12 into substantially the overall cavity 14.

While the cavity piece 20b is held in a given and elevated position, compressed air is fed into the cavity 14 from the flow channel 32 in an opposite direction, thus molding an article with resin while pressure is exerted onto the cavity 14 from the outside thereof. Air pressure exerted on the cavity 14 is 2 kg/cm2 or thereabouts, and a pressure of about 5 kg/cm2 is exerted onto the press cylinder 40. In a case where an article is molded with void(or air)-free resin, the pressure required to mold resin can be reduced to considerably small pressure. Specifically, since the resin is poured into the cavity while the release film 30 is withdrawn into a recess shape, there is need to apply slight pressure to bring the release film 30 into close contact with the inner surface of the cavity 14.

The left half of FIG. 1 with reference to center line A shows the molding of the article 10 with resin. When the article is molded with resin, power is applied to the heaters 24 to thus heat the cavity pieces 20a and 20b. As a result, the temperature of the resin 12 is increased to its setting temperature, thus accelerating setting of the resin 12.

The reason why the temperature of the cavity pieces 20a and 20b is set to a comparatively lower temperature when the resin is filled into the cavity 14 is to prevent non-filling failures, wire sweep, or voids from arising in the resin by ensuring the flowing characteristics of the resin 12. After resin has been filled into the cavity 14, setting of the resin 12 is accelerated by heating the resin, and pressure is applied to the outside of the cavity 14, thus enabling the molding characteristics of the resin to be improved so as to correspond to the shrinkage of the resin 12 caused when it sets.

When an article is molded with resin through use of the release film, it is also possible to adopt a method by which an article is molded with resin while the temperature of the cavity pieces 20a and 20b is constantly set to a setting temperature without increasing or decreasing the temperature which is performed in the present embodiment. In a case where the release film 30 is not used, there is a need to increase or decrease the temperature of the molding dies, because the resin comes into direct contact with the inner surface of the cavity 14. In contrast, in a case where an article is molded with resin through use of the release film 30, resin does not come into direct contact with the cavity piece 20a and 20b. Accordingly, an article can be molded while the temperature of the molding dies is held at a constant temperature, except for a case where an article is molded with a temperature-sensitive resin.

As mentioned previously, when resin is molded while the temperature of the molding dies is controlled so as to increase or decrease, the temperature of the cavity pieces 20a and 20b is controlled by regulating application of power to the heater 24. At this time, as a matter of course, the temperature of the overall molding die can be controlled so as to increase or decrease by simultaneously controlling application of power to the heaters 50 of the upper and lower molding dies 16a and 16b. Alternatively, an article can be molded with resin by controlling solely the temperature of the cavity pieces 20a and 20b while the temperature of the upper and lower molding dies 16a and 16b is held at a constant temperature in a temperature range in which the resin 12 slowly sets. Since the inner bottom surface of the cavity constituted of the end faces of the cavity pieces 20a and 20b occupies about 85% of the overall inner surface area of the cavity, an article can be molded with resin with sufficient accuracy even by controlling solely the temperature of the cavity pieces 20a and 20b.

A molded article is taken off from the molding dies after the resin 12 has set.

When a molded article is removed, the application of power to the heaters 24 of the cavity pieces 20a and 20b is shut off, and the application of air to the cavity 14 from the lower molding die 16b is also shut off in preparation for the next molding operation. These operations are intended to leave the molded article in the lower molding die 16b when the molding dies 16a and 16b are separated from each other by application of pressurized air to the cavity 14 from the upper molding die 16a.

Subsequently, the application of pressure to the press cylinder 40 is shut off, and the cavity piece 20b of the lower molding die 16b is lowered to a lower position. When the molding pieces are separated from each other in this state, the molding pieces are opened while the molded article remains on the lower molding piece 16b. Accordingly, the molded article is transferred to the outside of the molding die while remaining in contact with the release film 30. A product can be obtained by removing the release film 30 from the molded article. Since the release film 30 can be readily removed from the molded article, it is easy to separate a product from the release film 30.

Figure 4:
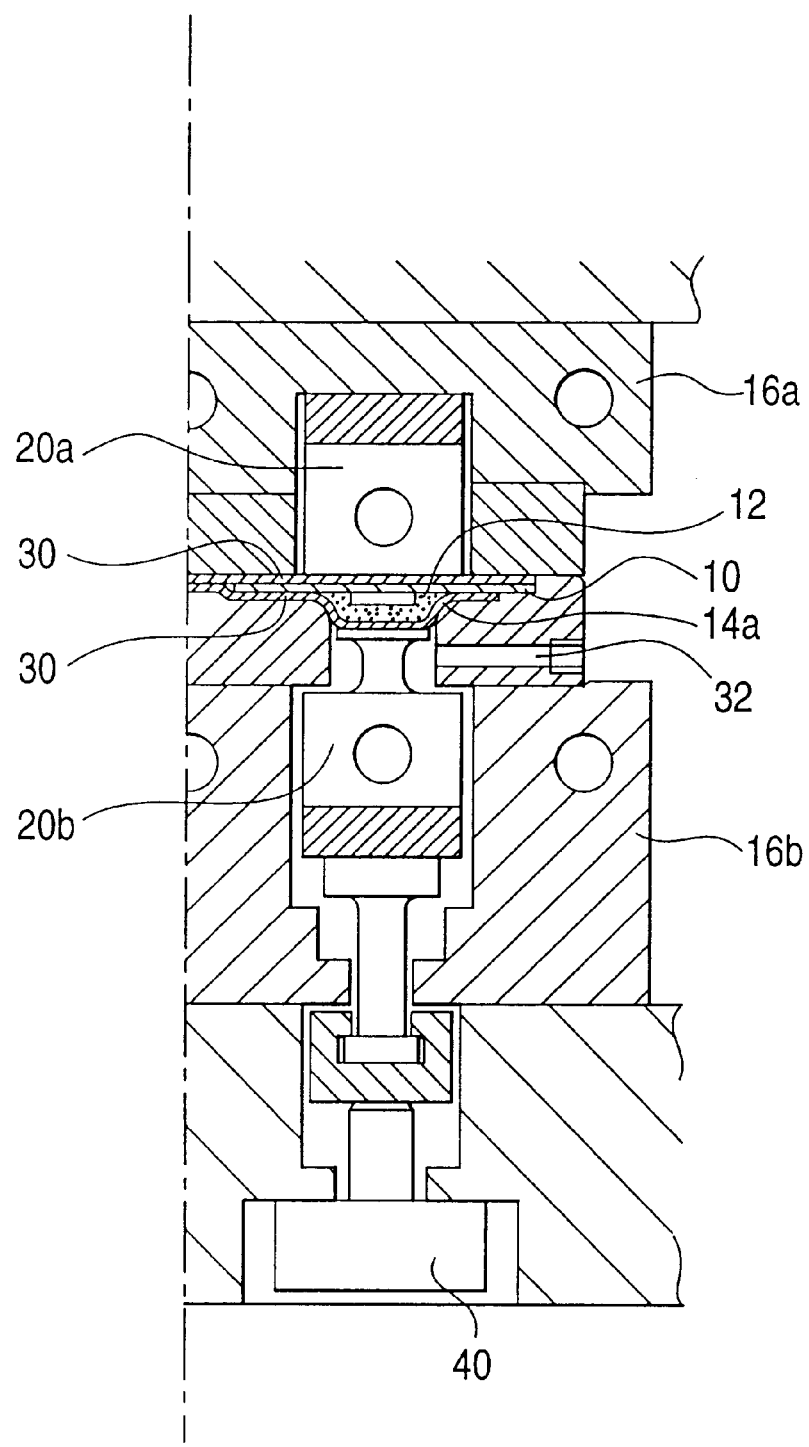
FIG. 4 is an explanatory view showing a resin molding method for a single-side resin molded product.

FIG. 4 shows an apparatus for manufacturing a single-side molded product. The resin molding apparatus according to another embodiment comprises the cavity indentation 14a formed in a lower molding die 16b. The parting surface of the cavity piece 20a of the upper molding die 16a is formed into a mere plane surface and supports the upper surface of the article 10.

The cavity piece 20b of the lower molding die 16b, the press cylinder 40, and the flow channel 32 for the purpose of sucking or applying air are the same as those described for the previous embodiment.

Even in the case of the resin molding apparatus according to the second embodiment, the article 10 is molded with resin by sucking the release film 30 so as to form a recessed storage section in the cavity indentation 14b for storing the amount of liquid resin required to mold the article, by feeding the resin 12 into the storage section, by placing the article 10 in the cavity, and by pushing the cavity piece 20b by means of the press cylinder 40, in the same manner as in the previous embodiment.

In the case of a single-side molded product such as that described for the preset embodiment, it is only necessary for the storage section formed in the lower molding die 10b to ensure a volume required to seal only a single side of the article 10. Contrasted with a double-side molded product such as that shown in FIG. 1, there is no need to ensure a large storage section for storing resin by lowering the cavity piece 20b to a great extent, and hence the extent of movement of the cavity piece 20b required for the second embodiment is nominal.

In the resin molding apparatus according to the second embodiment, a cavity indentation is formed solely in the lower molding die 16b, and the upper molding die 16a attracts solely the release film 30 along the parting surface of the molding die by suction. Even in the case of a double-side molded product, in a case where a wafer is molded with resin while the surface of the wafer on which a semiconductor chip is mounted is directed toward the lower molding die 16b, there is no need to bring the release film 30 in close contact with the cavity indentation of the upper molding die 16a by suction.

Figure 5:
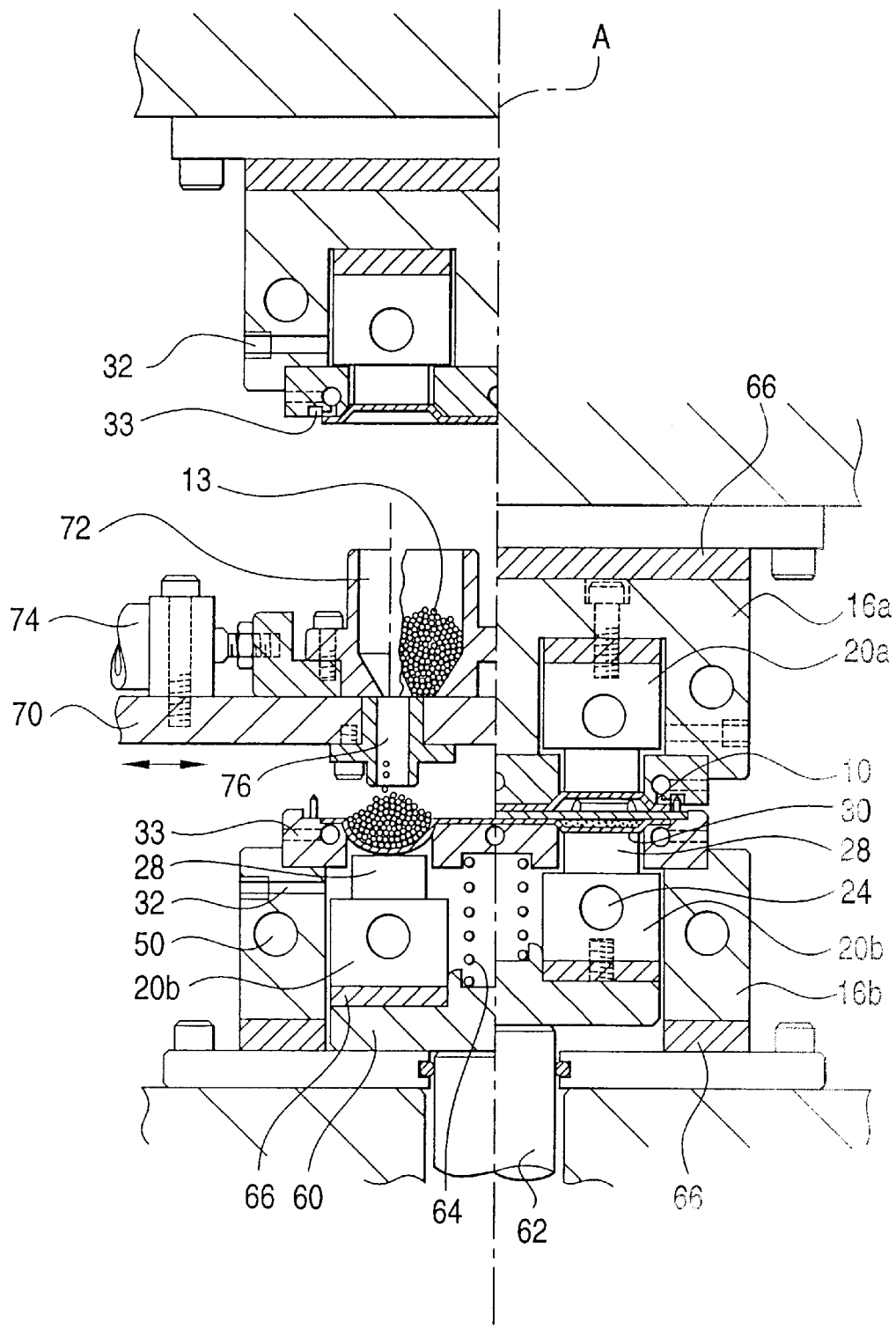
FIG. 5 is an explanatory view showing the structure of a resin molding apparatus which uses granular resin.

Although the resin molding apparatus according to the present embodiment molds an article with liquid resin by feeding the resin to the cavity, the resin used for the resin molding method according to the present invention is not limited to liquid resin. FIG. 5 shows a resin molding apparatus which molds an article with resin through use of granular resin 13. The cavity pieces 20a and 20b are substantially the same in structure as those used in the previous embodiments. According to a third embodiment, the lower molding piece 16b has a common press plate 60 for supporting the cavity pieces 20b provided for respective cavities. The press plate 60 is pressed by a press cylinder, thus elevating all the cavity pieces 20b. Here, the cavity pieces 20b are not provided separately for respective cavities but are integrally formed into a single angular rod. Bottom pieces 28 may be provided on the angular rod so as to correspond to each of the cavities. Reference numeral 62 designates a cylinder rod of the press cylinder, and reference numeral 64 designates a resilient spring for pushing and lowering the press plate 60. Reference numeral 66 designates heat insulating material.

The left half of FIG. 5 with reference to center line A shows feeding of the granular resin 13, and the right half of the same shows an article 10 to be molded is molded with resin. When resin is fed to the cavity, a device for feeding resin is introduced into the molding die while the molding dies are in an open state, and the granular resin 13 is dropped into each of the cavity indentations. The cavity indentation is covered with the release film 30, and a recessed storage section is formed by sucking the inner bottom surface of the cavity indentation. The granular resin 13 is stored into the storage section of the release film 30.

The resin feeding device comprises a storage pot 72 provided on a slide plate 70 for storing the granular resin 13. The storage pot 72 is supported so as to be movable between a charge position where resin is charged into the cavity indentation and a withdrawal position spaced apart from the charge position. Charge holes used for charging resin are formed in the slide table 70 so as to correspond to the positions of the cavity indentations. A guide tube 76 is fixedly fitted into each of the charge holes. While the charge pot 72 is held in the withdrawal position, the metered granular resin 13 is charged into each storage pot 72. When the slide table 70 is set in a given position of the molding die, the storage pot 72 is moved to the charge position (or the position of the charge hole) by actuation of the air cylinder 74.

After the granular resin 13 has been fed to the cavities, the articles 10 are set on the lower molding die 16b and are clamped between the molding dies. After the granular resin 13 has been melted, the press plate 60 is pressed by a press cylinder, thus pushing resin by way of the cavity pieces 20b. Resin is filled into the cavities, thus molding resin. Some types of resin contain a considerably small amount of void when in a liquefied state. So long as such resin is used, resin can be molded at a pressure of about 5 kg/cm2, as in the case of use of liquid resin.

Figure 6:
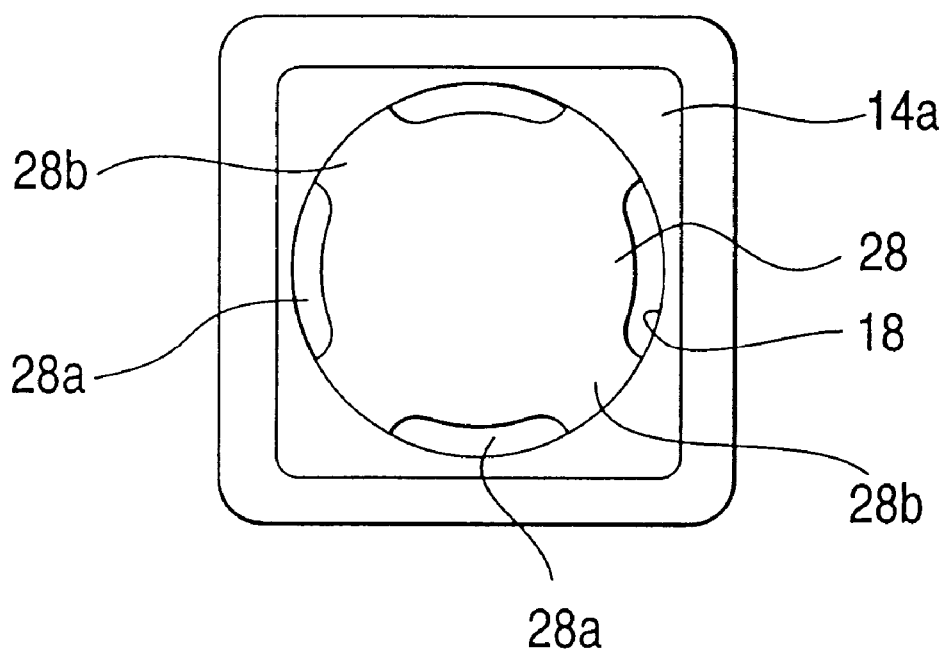
FIG. 6 is an explanatory view showing another structure of a bottom piece.

The cavity pieces 20a and 20b of the resin molding apparatus according to the present embodiment have the cavity holes 18 formed therein. Rod-shaped bottom pieces 28 are fitted into these cavity holes 18, respectively. Air is sucked from the area in the vicinity of the inner bottom surface of the cavity indentation through clearance created between the outer side surface of the bottom piece 28 and the inner side surface of the cavity hole 18. The channel used for sucking air from the area in the vicinity of the inner bottom surface of the cavity indentation may also be formed by forming the end face of the bottom piece 28 into the same rectangular shape as that of the rectangular inner bottom surface of the cavity indentation so as to form create slit-like clearance between the outer side surface of the bottom piece 28 and the inner side surface of the cavity hole 18. However, according to the present embodiment, the bottom piece 28 is formed into a columnar shape, and the cavity hole connected to the bottom surface of the cavity indentation is formed into an annular through hole which permits slidable entry of the bottom piece 28. As shown in FIG. 6, the circumference of the bottom piece 28 is partially notched, and a slot 28a is formed as an air flow channel between the inner side surface of the cavity hole 18 and the outer side surface of the bottom piece 28.

Notches can be readily formed in the outer side surface of the bottom piece 28 by milling. In practice, notches are formed into indentations of 0.02 to 0.10 mm or thereabouts. Ribs 28b formed as a result of notching of the outer side surface of the bottom piece 28 serve as guides for inserting the bottom piece 28 into the cavity hole 18. The method of forming the bottom piece 28 into a columnar shape and by notching the outer side surface of the bottom piece 28 to thereby form an air flow channel, such as that employed for the present embodiment, yields the advantage of easy machining and stable operation of the cavity pieces 20b. In a case where the columnar bottom piece 28 is formed, one bottom piece 28 may be provided for each cavity in a manner as shown in FIG. 6. Alternatively, a plurality of columnar (or pin-shaped) bottom pieces 28 may be provided for one cavity.

Under the resin molding method according to the present invention, an article is molded with resin by directly feeding resin to the cavities, and hence articles can be molded with different types of resin materials of different composition by feeding the materials to the cavities.

Figure 7:
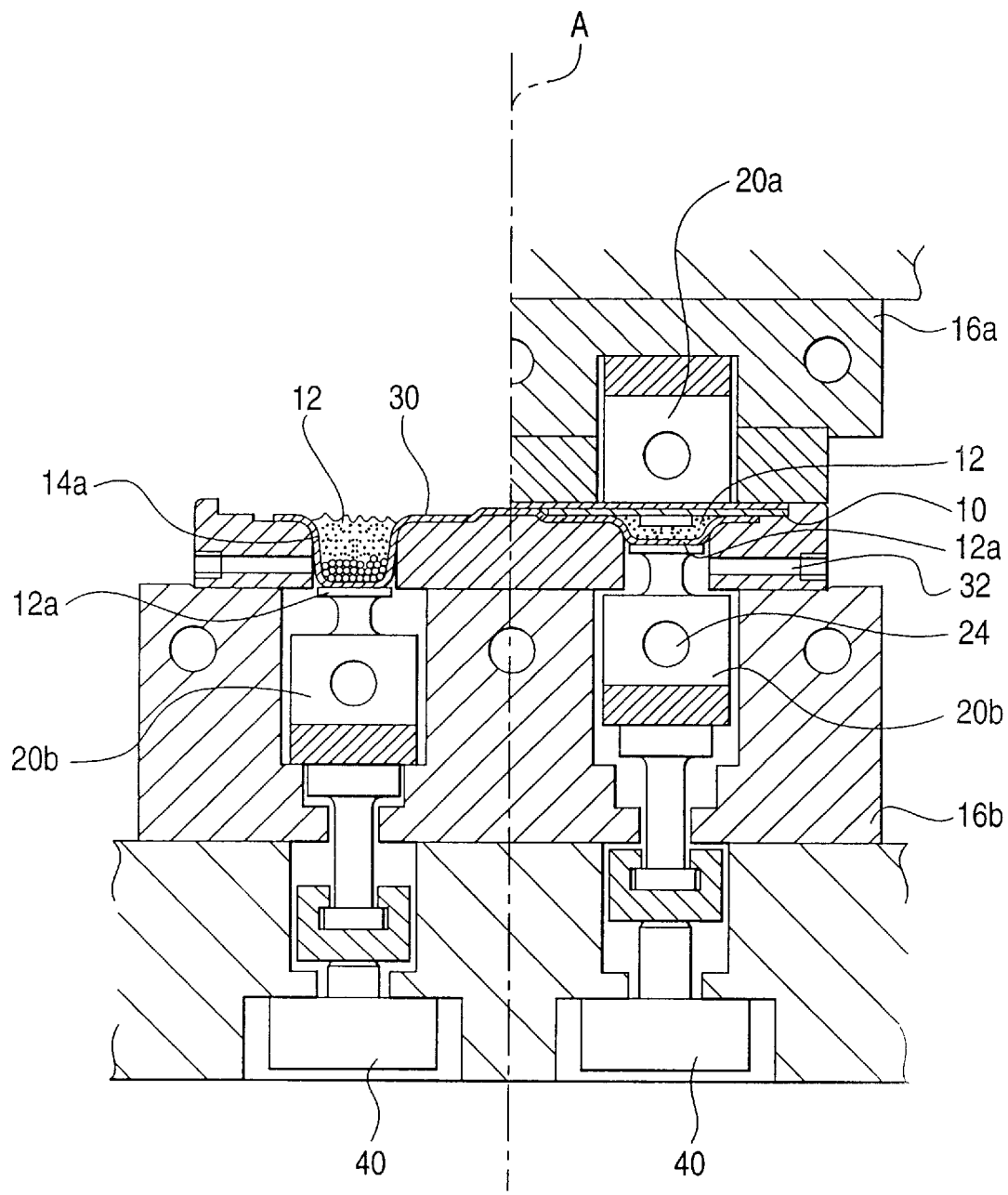
FIG. 7 is an explanatory view showing a resin molding method for a single-side resin molded product.

FIG. 7 shows manufacture of a single-side resin molded product, more particularly, a method of manufacturing a package having inclined resin composition in a thicknesswise direction of the package. The left half of FIG. 7 with reference to center line A shows the resin 12 for molding purposes fed to the cavity indentation 14a.

According to the present embodiment, when resin is fed to the cavity, a given amount of mixed resin 12a having a filler such as ceramic powder or metallic power added thereto is fed, which is followed by feeding of pure resin 12. As a result, a required amount of resin is fed. For example, the mixed resin 12a is used for the purpose of improving the heat conductivity of the package. As show in the drawing, when the mixed resin is set in such a way that when being fed to the storage section 30a, the filler settles out the bottom of the cavity by virtue of difference in specific gravity between the mixed resin 12a and the pure resin 12.

As mentioned previously, since the mixed resin 12a and the pure resin 12 are prepared and fed to the cavity, the filler of the mixed resin 12a resides on the bottom of the cavity. In this state, as in the case of the previous embodiments, the article 10 is set on the lower molding die 16b, and the article is clamped between the molding dies. A product having inclined resin composition in the thicknesswise direction of the package is produced by pushing and raising the cavity piece 20b.

To make the filler of the mixed resin 12a easy to settle out on the bottom of the cavity when resin is fed to the cavity, an vibration mechanism for applying oscillation to the cavity piece 20b in contact with the resin 12 may be provided for the press cylinder 40. Further, in order to prevent the composition of the mixed resin 12a from being disturbed at the time of molding of resin, it is better to slowly actuate the cavity piece 20b. In a case where a filler, such as ceramic powder or metallic powder, is mixed to the mixed resin 12a, interference may occur between a bonding wire and the filler. To prevent this problem, it is better to control the amount of filler so as to prevent adverse effect on the electrical characteristics of the package, as well as to mold the package with resin by causing the filler to settle out on the bottom of the cavity by means of the vibration mechanism.

As mentioned for the present embodiment, use of resin having ceramic powder mixed therein or resin having metallic powder mixed therein enables a package having improved heat conductivity to be produced without impairing the electrical characteristics of the package. Further, appropriate selection of composition of resin of a package or a filler added to resin enables realization of a package whose composition is more suitable for a product.

Although the a single-side resin molded product is shown in FIG. 7 as an example of package resin having controlled composition, the present invention can also be applied to a double-side resin molded product. Various modes for using liquid resin can be considered: that is, use of liquid resin having a filler added thereto, use of solid resin and liquid resin in combination, and use of solid resin of different types in combination.

Figure 8:
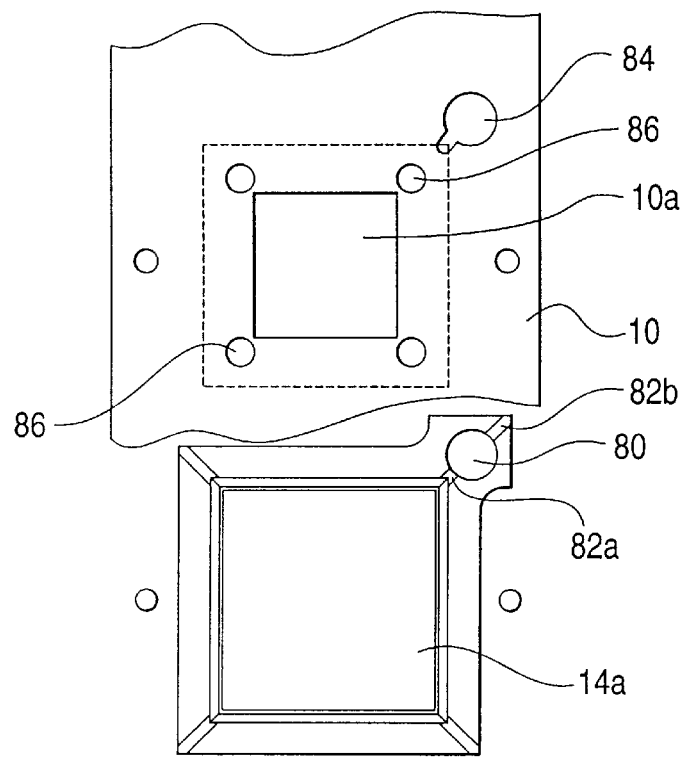
FIG. 8 is an explanatory view showing a resin molding method which uses a resin molding dies provided with a dummy cavity.
Figure 9:
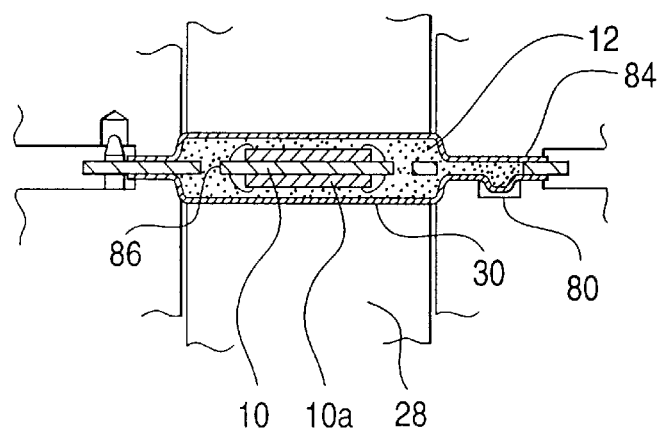
FIG. 9 is a cross-sectional view showing an article which is molded through use of the resin molding dies provided with the dummy cavity.

FIGS. 8 and 9 show a method of molding an article with resin through use of a dummy cavity. When an article is molded with resin by feeding the resin 12 to the cavity, if there is a deficiency of resin, the cavity is insufficiently filled with resin, thus resulting in a non-filling failure. In this way, in a case where the amount of resin to be supplied cannot be accurately metered, there is a case where a slightly greater amount of resin is supplied for molding. A dummy cavity is used for discharging an excessive amount of resin in the case of a resin molding method such as that mentioned above.

In FIG. 8, reference numeral 80 designates a dummy cavity, and the dummy cavity 80 is connected to the corner of the cavity indentation 14a by way of an air vent 82a. Another air vent 82b is further provided outside the dummy cavity 80. The article 10 is provided with a window 84 connected to the dummy cavity 80. With the foregoing arrangement, as shown in FIG. 9, even if there is an excess in the amount of resin when the article is molded with resin, the article is molded with resin while a portion of the resin 12 is discharged to the dummy cavity 80. The dummy cavity 80 also has the effect of causing air in the cavity or gas released from the resin 12 to escape by way of the air vents 82a and 82b.

Depending on the amount of resin 12 discharged to the dummy cavity 80, the resin is molded in such a way as to stretch the release film 30. Accordingly, the thus-set resin in the dummy cavity 80 can be readily separated by punching or the like after the molding operation. In the drawing, reference numeral 86 designates through holes 86 for the purpose of improving the filling characteristics of the resin 12 if the resin 12 is less likely to flow from one cavity to the other cavity while the molding cavities are separated from each other by presence of the article 10.

In a case where a film which permits passage of gas such as air or moisture and prevents passage of resin is used as the release film 30 during a molding operation, air trapped in the cavity or gas released from the resin can escape when an article is molded with resin while the cavity is filled with resin. There is yielded an advantage of improvement in the molding characteristics of resin. A porous film having minute pores formed therein, each pore measuring about 1 to 150 mm, is useful as the release film.

As has been described for the previous embodiments, according to the resin molding method according to the present invention, the resin 12 is directly fed to the cavity, thus eliminating the necessity for a resin flow channel such as runners or gates. Accordingly, resin is prevented from being used by a portion which is not involved in molding an article with resin, thus enabling most efficient use of resin.

Further, according to the resin molding method according to the present invention, an article can be molded with resin by solely feeding the resin 12 to the cavity indentation 14a, and by actuating the cavity piece 20b to a given molding position. It is only required for the resin 12 itself to be carried over a short distance during a molding operation, thus eliminating potential chance of air being mixed into the resin during transfer. As a result, voids or wire sweep due to flow of resin is prevented, thus enabling considerably reliable molding of an article.

Since the article 10 is clamped between the cavities through use of the release film 30 according to the present invention, the sealing characteristics of the article 10 are improved. Further, the pressure required to fill resin into the overall cavity 14 by raising the cavity piece 20b can be set to about 3 Torr, and the force required to clamp the article between the upper and lower molding dies 16a and 16b can be set to reduced to one-tenths or one-twentieths of the force required by the existing method. As a result, manufacture of molding dies becomes easy, and the structure of a mechanism to clamp the molding dies can be simplified.

The side surface of the bottom piece 28 belonging to each of the cavity pieces 20a and 20b is notched in the previous embodiments. The notches are intended to delay transfer of heat to the corner or side of the cavity 14 and to cause shrinkage arise in as distant area as possible from a chip during a molding operation, thus protecting a chip or interconnection runners, which are further minutely formed, from stress. The resin in the peripheral portion of the chip is first set by virtue of the shape of the bottom piece 28, and the resin in the corner of the chip is set late most.

Although an improvement in the filling characteristics of resin and superior molding of an article which does not cause wire sweep, are achieved in the previous embodiments by use of liquid resin 12 having high flowing characteristics, a high-quality void-free resin mold can be produced by the resin molding method according to the present invention, even when powdery or granular resin is used in place of liquid resin. Further, an efficient molding operation can be carried out without use of unnecessary resin. The resin molding method according to the present invention can be preferably applied to manufacture of a resin mold, such as a thin package, which requires high reliability and imposes difficulty in filling resin into a cavity under the existing method.

When an article having a plurality of slit-like gaps formed therein, such as a lead frame, is molded with resin through use of a release film, there arises a problem of the release film being not easily separated from the article after molding of the article. The reason for this is that when the lead frame is clamped between the molding dies by way of the release film, the release film enters and sticks to the gaps formed in the lead frame. Such a phenomenon is apt to arise in molding a lead frame which has minute lead pitches and is formed by etching.

Such a problem of the release film becoming less easy to be separated from the article at the time of molding of the article can be solved by the following method.

More specifically, after molding of the article, a suction circuit used for sucking the release film from the area in the vicinity of the inner bottom surface of the cavity indentation is turned on or off when the molding dies are slightly separated from each other. As a result, negative pressure arises in the cavity, and air flows into the cavity between the reverse side of the release film (i.e., the surface of the film in contact with the molding die) and the surface of the molding die. The flow of air has the effect of immediately cooling the reverse side of the release film, causing the release film to become shrunk and warped. The shrinkage and warpage of the release film has the effect of exfoliating the release film engaged in the gaps, thus enabling the release film to be separated from the lead frame. If the article and the release film firmly engage each other, the circuit is actuated several times until the film is released from the article.

With regard to a resin molding method and a resin molding apparatus according to the present invention, both of which use liquid resin, as mentioned previously, the resin molding method which uses a release film enables molding of an article with resin without a necessity for undesired resin during a molding operation by feeding resin to a cavity indentation, thus enabling considerably efficient molding of the article. Further, the article is molded by pressing a cavity piece within a cavity hole, resulting in a reduction in the distance over which the resin is carried and in the speed at which the resin is carried. Accordingly, air is prevented from being mixed into the resin during a molding operation, enabling prevention of wire sweep and protection of a chip from a hard filler. Further, the article is molded by controlling the temperature of the cavity piece so as to maintain the flowing characteristics of resin in a superior state, resulting in a noticeable advantage of being able to achieve high-quality and highly-reliable resin mold.

What is claimed is:

1. A resin molding method by which a resin is molded to an article clamped between an upper molding die and a lower molding die, wherein a cavity indentation is formed by (1) an end face of a cavity piece provided in a cavity hole formed in the lower molding die and (2) an internal wall surface of the cavity hole, the method comprising the steps of:

arranging the cavity piece to be movable in a direction in which the upper and the lower molding dies are opened or closed;

covering a parting surface of each of the upper and the lower molding dies with a release film;

sucking the release film into the cavity indentation to form a storage section for storing the resin;

feeding the resin directly into the storage section of the release film;

positioning the article on the lower molding die and clamping the article between the upper and the lower molding dies; and moving the cavity piece to a resin molding position to mold the resin to the article.

2. The resin molding method according to claim 1, further comprising the step of sucking the release film covering the lower molding die from an inner bottom surface of the cavity indentation.

3. The resin molding method according to claim 1, further comprising the step of applying pressure to the resin from an inner bottom surface of the cavity indentation.

4. The resin molding method according to claim 1, wherein the resin is a thermosetting resin.

5. The resin molding method according to claim 4, further comprising the steps of:

maintaining the temperature of the upper and the lower molding dies at about a glass transition temperature of the resin during a period of time over which the cavity piece is moved to the resin molding position; and subsequently, increasing the temperature of the upper and the lower molding dies to a curing temperature of the resin.

6. The resin molding method according to claim 1, wherein the resin is a liquid resin, and further comprising the step of feeding a metered amount of resin into the storage section.

7. The resin molding method according to claim 1, wherein the resin is a granular resin, and further comprising the step of feeding a metered amount of resin into the storage section.

8. The resin molding method according to claim 1, wherein the resin is a combination of a plurality of resins having different compositions.

9. The resin molding method according to claim 8, wherein one of the plurality of resins is a resin having a filler which settles on a bottom of the storage section.

10. The resin molding method according to claim 1, further comprising the step of molding the resin at a pressure of 1 to 5 Torr.

11. The resin molding method according to claim 1, the release film permits passage of a gas and prevents passage of the resin.

12. The resin molding method according to claim 9, wherein the filler is selected from the group consisting of ceramic powder and metallic powder.

13. The resin molding method according to claim 1, further comprising the step of feeding compressed air into the cavity hole of the lower molding die, when the lower molding die is in the resin molding position.

14. The resin molding method according to claim 1, further comprising the step of vibrating the cavity piece, once the resin is fed into the storage section of the release film.

15. The resin molding method according to claim 1, further comprising the step of flowing the resin over a large area in a vacuum while an ultrasonic wave is applied to the resin.

16. The resin molding method according to claim 1, wherein, in the resin feeding step, the resin does no flow through a flow path provided in the upper molding die or the lower molding die.

17. The resin molding method according to claim 1, wherein the resin is non-expandable.

* * * * *